(12) United States Patent
Ikeda et al.

(10) Patent No.: US 9,893,242 B2
(45) Date of Patent: Feb. 13, 2018

(54) LIGHT EMITTING DEVICE

(71) Applicant: NICHIA CORPORATION, Anan-shi, Tokushima (JP)

(72) Inventors: Tomohiro Ikeda, Komatsushima (JP); Masaaki Katsumata, Anan (JP); Yohei Inayoshi, Komatsushima (JP); Kazuhito Fukui, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/277,662

(22) Filed: Sep. 27, 2016

(65) Prior Publication Data

US 2017/0092817 A1     Mar. 30, 2017

(30) Foreign Application Priority Data

Sep. 30, 2015   (JP) ................. 2015-193976

(51) Int. Cl.
| | |
|---|---|
| *H01L 33/48* | (2010.01) |
| *H01L 33/50* | (2010.01) |
| *H01L 33/58* | (2010.01) |
| *H01L 33/62* | (2010.01) |
| *H01L 33/60* | (2010.01) |
| *H01L 33/54* | (2010.01) |
| *H01L 33/56* | (2010.01) |

(52) U.S. Cl.
CPC .......... *H01L 33/483* (2013.01); *H01L 33/486* (2013.01); *H01L 33/507* (2013.01); *H01L 33/58* (2013.01); *H01L 33/62* (2013.01); *H01L 33/54* (2013.01); *H01L 33/56* (2013.01); *H01L 33/60* (2013.01); *H01L 2224/16225* (2013.01)

(58) Field of Classification Search
CPC ....... H01L 33/48; H01L 33/483; H01L 33/50; H01L 33/507; H01L 33/58; H01L 33/60; H01L 33/62
USPC .......................................... 257/98
See application file for complete search history.

(56) References Cited

U.S. PATENT DOCUMENTS

| | | | |
|---|---|---|---|
| 8,643,047 B2 * | 2/2014 | Uemura | F21S 8/04 257/98 |
| 2006/0171152 A1 | 8/2006 | Suehiro et al. | |
| 2016/0013375 A1 * | 1/2016 | Miyazaki | H01L 33/54 257/100 |

FOREIGN PATENT DOCUMENTS

| | | |
|---|---|---|
| JP | 63-239893 A | 10/1988 |
| JP | 10-173303 A | 6/1998 |
| JP | 2004-160977 A | 6/2004 |
| JP | 2005-244152 A | 9/2005 |

(Continued)

*Primary Examiner* — Monica D Harrison
(74) *Attorney, Agent, or Firm* — Squire Patton Boggs (US) LLP

(57) ABSTRACT

A light emitting device is provided that can restrain deterioration of a mount substrate made of resin, the light emitting device including: a support member that is made of resin; a pair of wirings that are arranged on the support member; a light emitting element that is arranged to cross the pair of wirings and that has a pair of electrodes on one side running in parallel to the pair of wirings so as to be electrically connected; and a vaporproof member in a film shape that seamlessly covers an upper face of the support member, at least, in a region where the light emitting element is arranged between the pair of wirings in a plan view, wherein the vaporproof member has a higher vaporproof property than that of the support member.

22 Claims, 9 Drawing Sheets

(56) References Cited

FOREIGN PATENT DOCUMENTS

| | | | |
|---|---|---|---|
| JP | 2005-259888 | A | 9/2005 |
| JP | 2005-322937 | A | 11/2005 |
| JP | 2006-100444 | A | 4/2006 |
| JP | 2006-216753 | A | 8/2006 |
| JP | 2008-091459 | A | 4/2008 |
| JP | 2011-243963 | A | 12/2011 |
| JP | 2012-059867 | A | 3/2012 |
| JP | 2012-146942 | A | 8/2012 |
| JP | 2012-186454 | A | 9/2012 |
| JP | 2013-033909 | A | 2/2013 |
| JP | 2013-038384 | A | 2/2013 |
| JP | 2014-078686 | A | 5/2014 |
| JP | 2015-012206 | A | 1/2015 |
| JP | 2015-119013 | A | 6/2015 |
| JP | 2015-122448 | A | 7/2015 |

\* cited by examiner

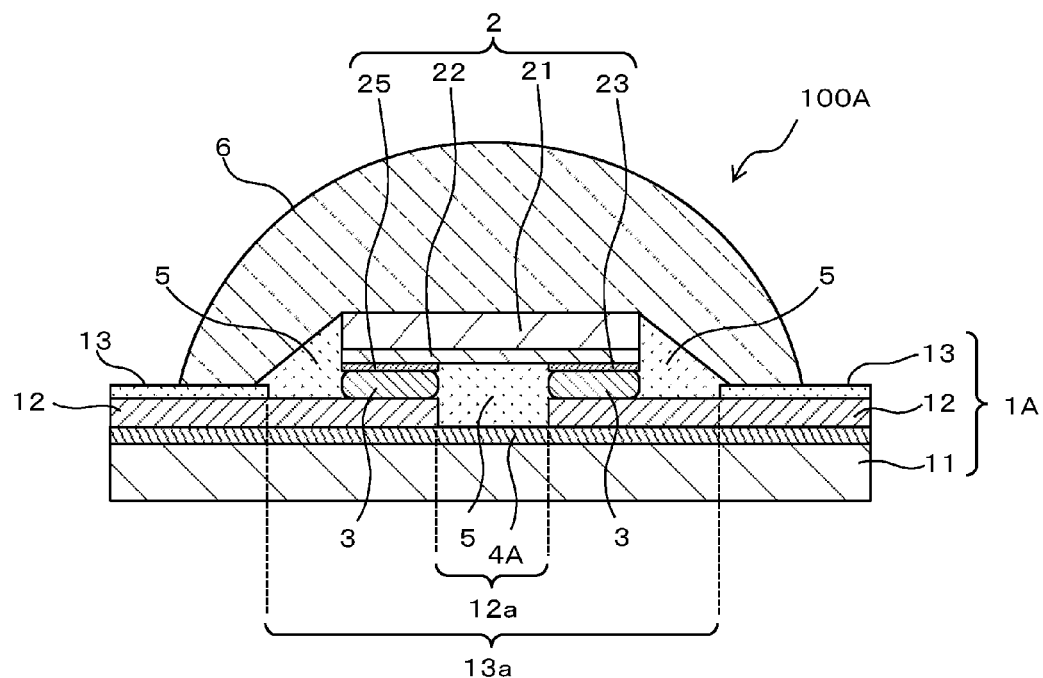
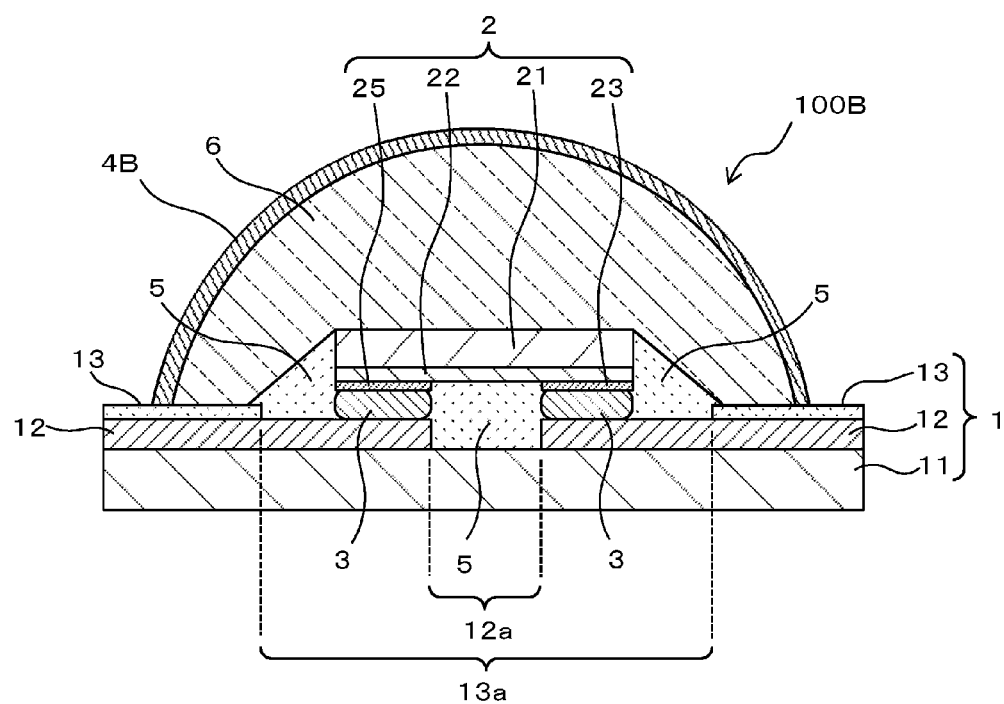

LIGHT EMITTING DEVICE

CROSS REFERENCE TO RELATED APPLICATION

This application claims the benefit of priority to Japanese Patent Application No. 2015-193976, filed on Sep. 30, 2015, the entire specification, claims and drawings of which are incorporated herewith by reference.

BACKGROUND OF THE INVENTION

Field of the Invention

The present invention relates to a light emitting device.

Description of the Related Arts

A light emitting device has been proposed in which light emitting elements are arranged on a flexible mount substrate made of resin. For example, in light emitting devices disclosed in Japanese Patent Application Publication Nos. 2005-322937 and 2015-12206, light emitting elements are bonded with conducting regions formed on the mount substrate via bumps to be flip-chip mounted.

A light emitting device disclosed in Japanese Patent Application Publication No. 2005-322937 uses polyimide as a base of the mount substrate. Light from light emitting elements is irradiated on the base to cause the base, especially near the light emitting elements, to be deteriorated, so as to give bad effects on dielectric strength voltage of the mount substrate.

Japanese Patent Application Publication No. 2015-12206 discloses a light emitting device in which a bonding layer for bonding a base made of polyimide of the mount substrate with wiring portions contains a light shielding substance to restrain light irradiation on the base, preventing the base from being deteriorated.

SUMMARY OF THE INVENTION

A light emitting device according to a first aspect of the present invention includes: a support member that is made of resin; a pair of wirings that are arranged on the support member; a light emitting element that is arranged to cross the pair of wirings and that has a pair of electrodes on one face side running in parallel to the pair of wirings so as to be electrically connected; and a vaporproof member in a film shape that seamlessly covers an upper face of the support member, at least, in a region where the light emitting element is arranged between the pair of wirings in a plan view, wherein the vaporproof member has higher vaporproof property than that of the support member.

Further, a light emitting device according to a second aspect of the present invention includes: a support member being insulative and flexible in a sheet shape; a pair of wirings arranged on the support member; and a light emitting element that is arranged to cross the pair of wirings and that has a pair of electrodes on one side running in parallel to the pair of wirings so as to be electrically connected, wherein the support member has a moisture vapor permeability rate of 20.0 g/(m²·day) or less.

The light emitting device according to the present invention can restrain deterioration of a mount substrate made of resin to improve reliability.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

FIG. 6 is a cross-sectional view showing a structure of a light emitting device according to a second embodiment;

FIG. 7 is a cross-sectional view showing a structure of a light emitting device according to a third embodiment;

DETAILED DESCRIPTION OF THE PREFERRED EMBODIMENTS

Figure 1A:
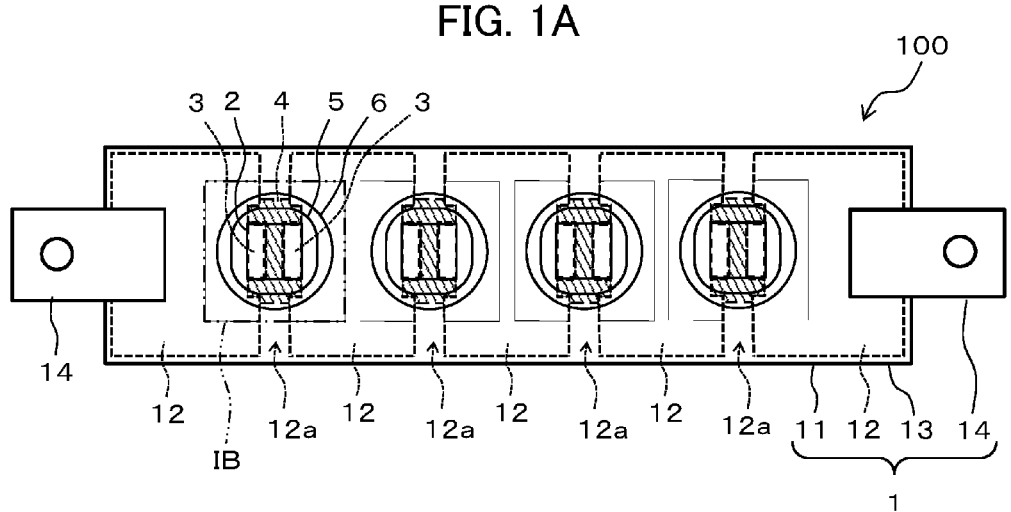
FIG. 1A is a plan view showing a structure of a light emitting device according to a first embodiment.

The embodiments will now be described with reference to the accompanying drawings, wherein like reference numerals designate corresponding or identical elements throughout the various drawings.

Prior to describing light emitting devices according to the embodiments, a description will be given of how a resin material used for a support member of a light emission device is deteriorated due to light irradiation from light emitting elements.

It has been known that a resin material is deteriorated due to light irradiation from light emitting elements. Inventors of the present invention have found that a resin material remarkably deteriorates due to light irradiation under a high-humidity environment.

Deterioration Test of Resin Material Due to Light Irradiation

Figure 11:
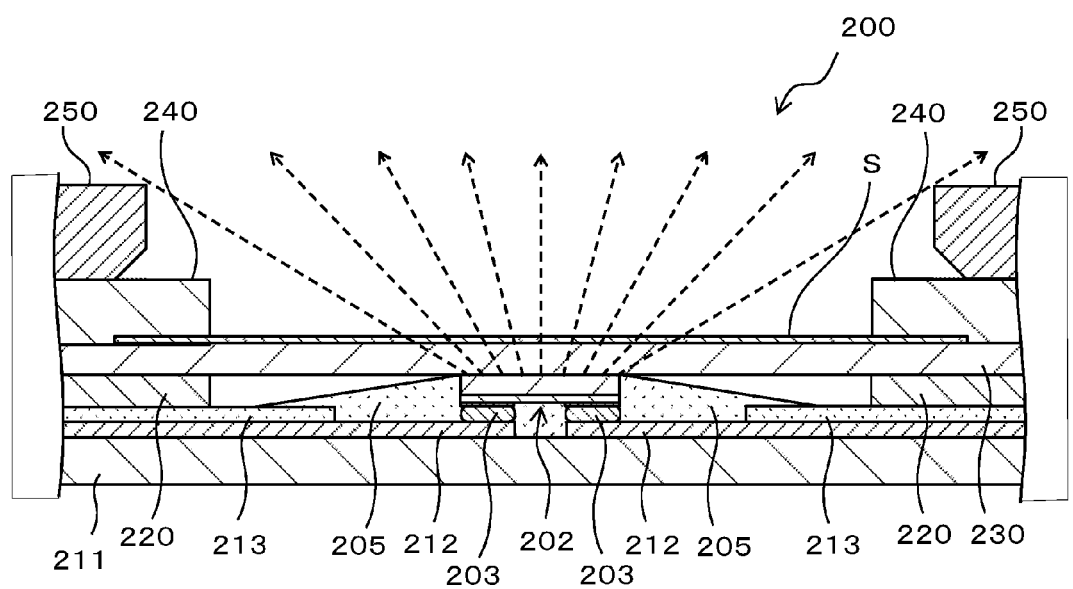
FIG. 11 is a cross-sectional view showing a lighting device for evaluating light resistance.

Referring to FIG. 11, a test (evaluation of light resistance) will be described, with respect to a relation between a temperature/humidity environment and a deterioration level of a resin material due to light irradiation. FIG. 11 is a cross-sectional view showing a structure of a lighting device for evaluating light resistance.

Lighting Device for Evaluating Light Resistance

In a lighting device 200 for evaluating light resistance, an LED chip 202 is flip-chip mounted via a bonding member 203 on a mount substrate provided with wirings 212 on a substrate 211. Further, a light reflective film 213 is arranged on an upper face of the mount substrate, except a region near the LED chip 202. An underfill 205 made of white resin is arranged on a side face and a lower face of the LED chip 202, and light is emitted from an upper face of the LED chip 202. A cover glass 230 is arranged on the mount substrate via a spacer 220 made of PET containing white pigment, and an upper face of the cover glass 230 is used as a loading table for a sample S to be evaluated. Further, a peripheral portion of the sample S is held by a silicone rubber sheet 240 and a holding jig 250.

Note that the LED chip 202 is a square of side 600 µm in a plan view and includes a blue LED having a wavelength of 450 nm as a light emission peak wavelength of a light emission spectrum. Further, the cover glass 230 has a thickness of about 0.12 mm to 0.17 mm.

The sample S is arranged to be irradiated by light emitted from the upper face of the LED chip 202 in the lighting device 200. Note that, in light emission devices according to embodiments to be described later, an amount of light irradiated on the support member due to leakage light from the lower face and the side face of the light emission element is approximately 1/10 of an amount of light irradiated on the sample S by the lighting device 200 for evaluating light resistance.

Test Procedure

Two kinds of commercially available PET (polyethylene terephthalate) films are used as the samples S (samples 1, 2) made of a resin material corresponding to the support member.

The sample S is arranged on the cover glass 230 as the loading table of the lighting device 200 and the LED chip 202 is lit up to irradiate light on the sample S continuously.

A light irradiation time is measured till the film as the sample S is deteriorated to have a hole (such as cracking or perforation) therein.

The test is executed under three kinds of temperature/humidity conditions as environmental conditions for irradiating the light.

Note that the sample 1 is the "Lumirror (trademark) T60" film having a film thickness of 50 µm manufactured by Toray Industries. Inc.

Further, the sample 2 is the "Tetron (trademark) UF" having a film thickness of 50 µm manufactured by Teijin DuPont Films Limited.

Test Results

The test results are shown in a table 1. Note that, in the table 1, "dry" indicates that a humidity is 40% RH or less.

TABLE 1

| Environment (temperature, humidity) | 60° C., dry | 85° C., dry | 85° C., 85% RH |
|---|---|---|---|
| Sample 1 | 2000 | 1800 | 72 |
| Sample 2 | 2000 | 1700 | 96 |

(Unit: [h])

The samples 1 and 2 are PET films having the same film thickness and have substantially the same trends. In other words, under the "dry" condition where humidity is comparatively low, there is little change within a temperature range of about 60° C. to 85° C. and the time till a hole is formed in the film due to light irradiation is about 1700 to 2000 hours. On the other hand, if the humidity is as high as 85% RH, even with the temperature of 85° C., the time till a hole is formed in the film becomes very short such as 72 to 96 hours, to indicate that, under the high humidity condition, the resin material remarkably deteriorates due to light irradiation.

The light emitting device according to each embodiment described below is configured to cover an upper face of the support member which is irradiated by light from the light emitting elements with a vaporproof member to restrain permeation of vapor to the support member for restraining deterioration of the support member.

Note that, in the description below, since the drawings illustrate the embodiments schematically, a scale of each member, distance, positional relationships, etc. may be exaggerated or portions of members may not be illustrated. Further, in the description below, the same names and numerals basically indicate the same or similar members, and detailed descriptions thereof will be omitted.

First Embodiment

Structure of Light Emitting Device

Referring to FIGS. 1A to 3, a structure of the light emitting device according to the first embodiment will be described.

Figure 1B:
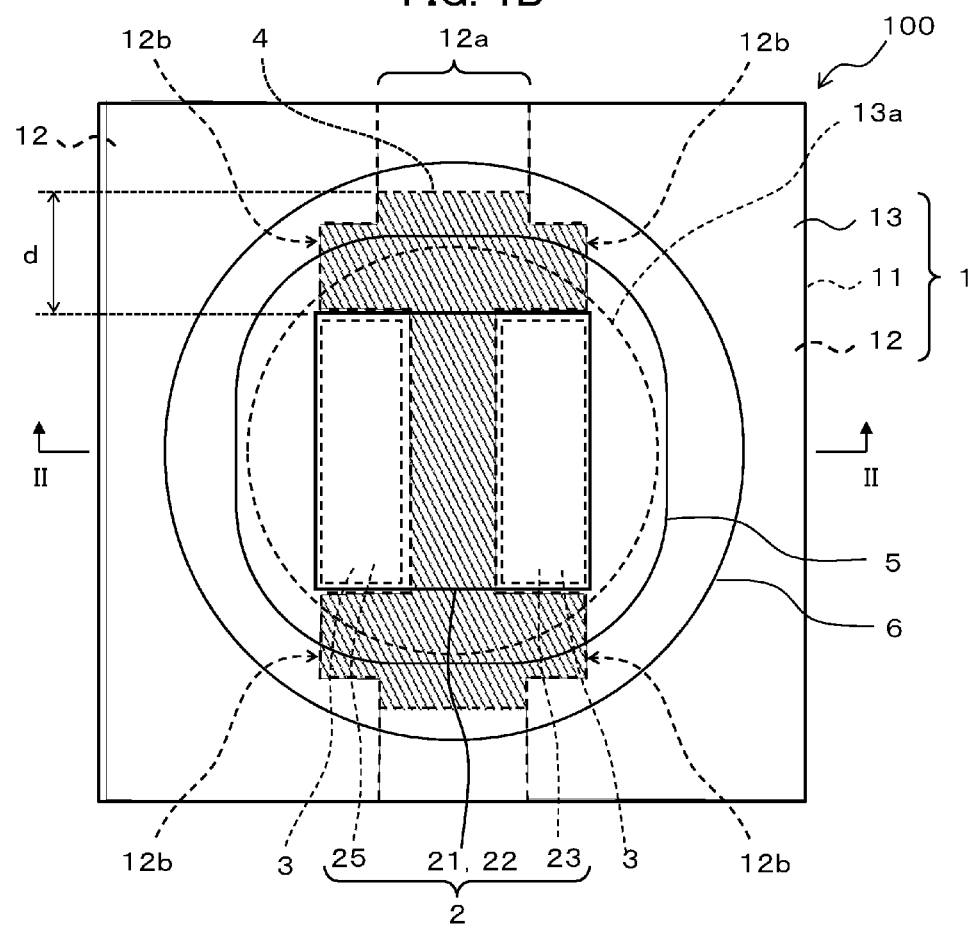
FIG. 1B is an enlarged plan view of a region IB in FIG. 1A, showing the structure of the light emitting device according to the first embodiment.
Figure 2:
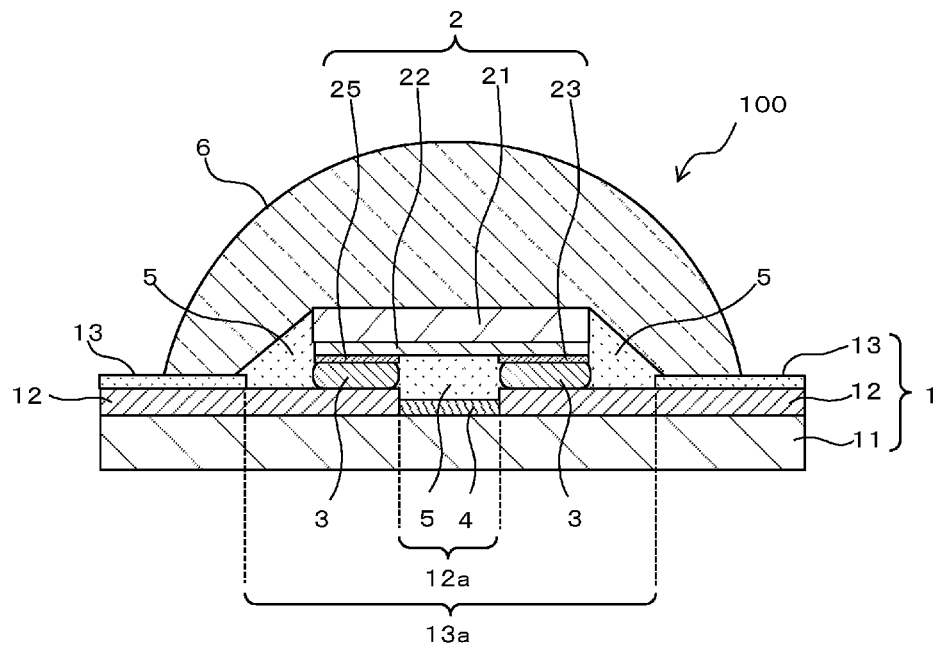
FIG. 2 is a cross-sectional view along a II-II line in FIG. 1B, showing the structure of the light emitting device according to the first embodiment.
Figure 3:
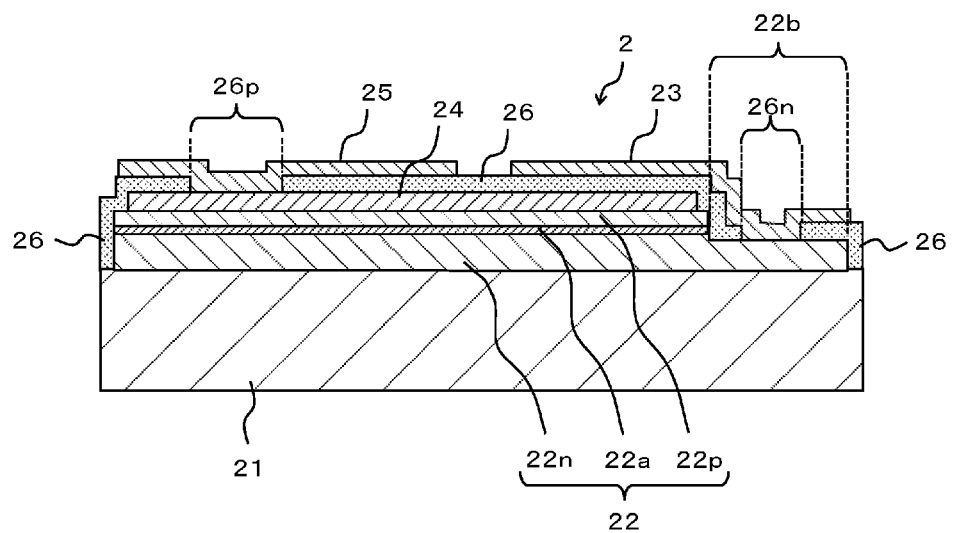
FIG. 3 is a cross-sectional view showing an exemplary structure of a light emitting element used in the light emitting device according to the first embodiment.

FIG. 1A is a plan view showing the structure of the light emitting device according to the first embodiment. FIG. 1B is an enlarged plan view of a region IB in FIG. 1A, showing the structure of the light emitting device according to the first embodiment. FIG. 2 is a cross-sectional view along a II-II line in FIG. 1B showing the structure of the light emitting device according to the first embodiment. FIG. 3 is a cross-sectional view showing an exemplary structure of a light emitting element used in the light emitting device according to the first embodiment.

Note that FIGS. 1A and 1B are plan views and a region where the vaporproof member is arranged is indicated with hatching. Further, in FIG. 3, a face arranged with an n-side electrode 23 and a p-side electrode 25 is illustrated to face upward, which is upside down to FIG. 2. Still further, in FIGS. 1A to 2 and FIGS. 5D to 10 to be described later, the structure of the light emitting elements 2 is simplified.

A light emitting device 100 according to the first embodiment is configured to include a mount substrate 1 that is a flexible substrate having an approximately rectangular shape laterally in a plan view, a plurality of (four) light emitting elements 2 that are each mounted on an upper face of the mount substrate 1 via a bonding member 3, vaporproof members 4 which are arranged to cover an upper face of the mount substrate 1 at regions directly under the light emitting elements 2 and peripheral regions thereof in a plan view, underfill 5 which cover lower faces and side faces of the light emitting elements 2, and light transmissive members 6 which cover the light emitting elements 2.

The mount substrate 1 is configured to include a support member 11 that is flexible and in a sheet shape, a plurality of wirings 12 which are arranged apart from one another on an upper face of the support member 11, a light reflective film 13 which covers the entire upper face of the support member 11 except the regions where the light emitting elements 2 are arranged and peripheral regions thereof, and terminals 14 to be connected with an external power source.

Note that the mount substrate 1 is a flexible substrate, but can be a rigid substrate if the support member 11 is made of resin.

The support member 11 is made of resin or a material containing resin, and in an sheet shape or a plate shape that is insulative and has a flat upper face. Therefore, the upper face of the support member 11 is formed flat from a region under the wirings 12 through a region between the wirings 12.

The material for the support member 11 may contain at least one selected from polyethylene-telephthalate, polyethylene naphthalate, polyimide, polyamide, polyphenylene sulfide, resin containing clay mineral, fluororesin, polyethylene, polypropylene, polycarbonate, polybutylene terephthalate, or glass epoxy resin.

The support member 11 preferably has a thickness of about 4 μm to 30 μm so as to be flexible for use as a flexible substrate.

The wirings 12 are electric conductive members arranged on the upper face of the support member 11. The plurality of wirings 12 are arranged in series at predetermined intervals of a gap 12a in a lateral direction. One light emitting element 2 is arranged to cross the gap 12a between adjacent wirings 12 to each other.

Further, each wiring 12 includes recessed portions (cut-outs) 12b to fit the shapes of the n-side electrode 23 and p-side electrode 25 and to position respectively therebetween, of the light emitting element 2. By forming the recessed portions 12b, the light emitting element 12 can be aligned by self-alignment effect when the light emitting element 2 is mounted by the reflow method with solders as the bonding member 3.

The wirings 12 may be formed by metal foil or metal powder such as Cu, Al or an alloy thereof. To make the mount substrate 1 as a flexible substrate, a film thickness of the wirings 12 is preferably about 10 μm to 50 μm.

The light reflective film 13 is arranged to cover the entire upper surfaces of the support member 11 and the wirings 12, except the regions where the light emitting elements 2 are arranged and peripheral regions thereof. The light reflective film 13 may be omitted, but is preferably arranged to improve light extraction capability of the light emitting device 100. In the mount substrate 1, the light reflective film 13 is arranged to have circular openings 13a in a plan view at the regions where the light emitting elements 2 are arranged and peripheral regions thereof.

For the light reflective film 13, white resin may be preferably used in which, for example, white pigment of a light reflective substance such as titanium oxide, aluminum oxide, zinc oxide, barium carbonate, barium sulfate and a glass filler is contained in light transmissive resin. The light reflective film 13 is formed in a film shape on the upper faces of the support member 11 and the wirings 12 with white ink made of the white resin in a liquid state by various methods such as the printing method and the coating method.

The terminals 14 are used for external connection to connect the mount substrate 1 with an external power source and are electrically connected with respective wirings 12 arranged at the left end and the right end. The terminals 14 may be metal plates such as Cu and Al. Note that a portion of the wiring 12 may be used as a terminal for external connection.

The light emitting element 2 is approximately in a rectangular shape in a plan view and includes a substrate 21, a semiconductor layered body 22, the n-side electrode 23, a full-surface electrode 24, the p-side electrode 25 and an insulating film 26. The light emitting element 2 is an LED chip having the semiconductor layered body 22 layered with an n-type semiconductor layer 22n, an active layer 22a and a p-type semiconductor layer 22p on one main face of the substrate 21. Further, the semiconductor layered body 22 is configured to emit light by connecting the external power source to the n-side electrode 23 and p-side electrode 25 to supply power.

The semiconductor layered body 22 includes a region where the p-type semiconductor layer 22p and the active layer 22a are not partially arranged, that is, an exposed portion 22b in which the n-type semiconductor layer 22n is exposed on an upper face of the semiconductor layered body 22. The exposed portion 22b includes the n-side electrode 23 to be electrically connected with the n-type semiconductor layer 22n. Note that the exposed portion 22b is covered with the n-side electrode 23 and the insulating film 26, but is referred to as the "exposed portion" for convenience.

The full-surface electrode 24 having good conductivity and light reflectivity is arranged on the nearly entire upper face of the p-type semiconductor layer 22p, and the p-side electrode 25 is further arranged on a portion of the full-surface electrode 24. In addition, the face of the semiconductor layered body 22 is covered with the insulating film 26 directly or via the full-surface electrode 24, except a portion of the upper face of the exposed portion 22b and a portion of the upper face of the full-surface electrode 24. Further, the n-side electrode 23 and p-side electrode 25 are arranged to extend outward of the insulating film 26 from apertures 26n, 26p of the insulating film 26.

A nitride semiconductor expressed as $In_XAl_YGa_{1-X-Y}N$ ($0 \leq X$, $0 \leq Y$, $X+Y \leq 1$) may be preferably used for the semiconductor layered body 22 (n-type semiconductor layer 22n, active layer 22a and p-type semiconductor layer 22p). Further, suitable materials used in this technical filed are appropriately selected for the substrate 21, the n-side electrode 23, the full-surface electrode 24, the p-side electrode 25 and the insulating film 26, as with the above mentioned semiconductor layered body 22.

Further, the light emitting element 2 has the n-side electrode 23 and p-side electrode 25 on one side having an appropriate structure for flip-chip mounting. One light emitting element 2 is arranged to cross the gap 12a between a pair of wirings 12 which are adjacently arranged to each other to form a pair, and the n-side electrode 23 and p-side electrode 25 are bonded on the upper faces of the paired wirings 12 via the bonding member 3.

Note that the four light emitting elements 2 are electrically connected in series via the wirings 12 in the light emitting device 100, but the number of light emitting elements 2 and the formation of the electric connection are not limited thereto. At least one light emitting element 2 may be arranged in the light emitting device 100.

The bonding member 3 is conductive and used for bonding the n-side electrode 23 and p-side electrode 25 of the light emitting element 2 with the wirings 12 of the mount substrate 1.

A wire bump with an Au wire or a plated bump made of a metal material such as Au, Cu is used as the bonding member 3. In a case where such a metal bump is used as the bonding member 3, the bonding member 3 may be arranged to bond with the n-side electrode 23 and p-side electrode 25 of the light emitting element 2 or with each wiring 12 in advance before the light emitting element 2 is bonded on the mount substrate 1. In this case, the light emitting element 2 may be bonded on the mount substrate 1 by the ultrasonic bonding method.

Further, a solder such as an AuSn based alloy, an Sn based lead-free solder may be used as the bonding member 3. In this case, the light emitting element 2 may be bonded on the mount substrate 1 by the reflow method.

The vaporproof member 4 is arranged to seamlessly cover the upper face of the support member 11 in the gap 12a where the wirings 12 are not arranged in the region directly under the light emitting element 2 and peripheral region thereof in a plan view.

As mentioned above, the resin material used as the support member 11 has a remarkable degree of deterioration due to the light irradiation from the light emitting element under a high-humidity environment. Further, even if the light emitting element 2 has the full-surface electrode 24 having light reflectivity, light is leaked from a lower face side of the light emitting element 2 and is irradiated on the support member 11. Still further, the regions where the wirings 12 are arranged are shielded by the metal films as the wirings 12, which prevents the light from irradiating directly on the upper face of the support member 11 where the wirings 12 are arranged, making the deterioration hardly occur.

By covering with the vaporproof member 4 a region irradiated strongly by the light from the light emitting element 2, deterioration of the support member 11 is restrained even if light from the light emitting element 2 is irradiated. The vaporproof member 4 is seamlessly arranged on the region directly under the light emitting element 2 where light from the light emitting element 2 is especially irradiated strongly, but is preferably arranged further seamlessly on the peripheral region of the light emitting element 2 where light from the light emitting element 2 is irradiated with relative strength.

The vaporproof member 4 may contain particles of the same light reflective substance as that used for the light reflective film 13 described above to improve light reflectivity. The vaporproof member 4 preferably has reflectance of 50% or more for the light from the light emitting element 2. Though the vaporproof member 4 preferably has higher reflectance for the light from the light emitting element 2, the reflectance for the light from the light emitting element 2 is set to be less than 80% to decrease the content of the light reflective substance, allowing the support member 11 to bond with the vaporproof member 4 tightly.

The peripheral region of the light emitting element 2 indicates a region where a distance d from the side face of the light emitting element 2 in a plan view is within a predetermined range, and the distance d may be, for example, about 2 mm, preferably about 5 mm, and more preferably about 10 mm or more. In other words, the vaporproof member 4 is arranged to cover seamlessly the region where the light from the light emitting element 2 is strongly irradiated on the upper face of the support member 11 as the base made of resin. Further, in the region where the light reflective film 13 is arranged, the vaporproof member 4 is arranged to cover the upper face of the support member 11 via the light reflective film 13.

Still further, the vaporproof member 4 may be arranged to extend to a region which is away from the light emitting element 2 at the predetermined distance d, for example, 2 mm or more, preferably 5 mm or more, and more preferably 10 mm or more. As a light output from the light emitting element 2 increases, the support member 11 is irradiated from strong light even at the longer distance d from the light emitting element 2, to likely cause the support member 11 to be deteriorated due to light.

The vaporproof member 4 is preferably formed with a material having higher vaporproof property than that of the support member 11 to have moisture vapor permeability rate defined by JIS K7129 (based on ISO 15106-1, ISO 15106-2 and ISO/DIS 15106-4) of 50 g/(m$^2$·day) or less, and more preferably of 20 g/(m$^2$·day) or less. Further, the vaporproof member 4 is preferably formed with a material having higher vaporproof property than that of a material generally used for the underfill 5 and the light transmissive member 6 as a sealing member.

Still further, to allow the mount substrate 1 to have flexibility, a film thickness of the vaporproof member 4 is preferably thin to an extent that the moisture vapor permeability rate mentioned above is satisfied, for example, about 100 μm or less. Yet further, the vaporproof member 4 preferably has a film thickness of about 50 μm or less. A distance between the light emitting element 2 and the support member 11 can be shorter and a height of the light emitting element 2 can be kept lower. In addition, the vaporproof member 4 having an even film thickness is used.

The vaporproof member 4 is made of a material having higher vaporproof property than that of the support member 11.

The vaporproof member 4 may be formed with an organic material, an inorganic material, or a hybrid material thereof.

An organic film which can be used as the vaporproof member 4 may contain at least one selected from polyvinylidene chloride, fluororesin, polyethylene, polypropylene, polybutylene terephthalate, silicone resin or its derivative, fluorocarbon (fluororesin) or paraxylene.

Further, an inorganic film which can be used as the vaporproof member 4 may contain at least one selected from titanium oxide, aluminum oxide, zinc oxide, barium carbonate, barium sulfate, silicon oxide, silicon nitride, silicon carbide, silicon oxide carbide, silicon carbide nitride, silicon oxide nitride, silicon oxide carbide nitride, carbon nitride, clay mineral or diamond-like carbon.

Still further, for the vaporproof member 4, a hybrid material film may be used in which particles of the material above as the inorganic film are contained in a resin material above as the organic film. Such a hybrid material film includes, for example, the "Toughclaist (trademark)" manufactured by SUMITOMO SEIKA CHEMICALS CO., LTD, which contains clay mineral of talc in polyimide resin.

The underfill 5 is formed to fill a space between the lower face of the light emitting element 2 and the upper face of the mount substrate 1 and to cover the side face of the light emitting element 2. Further, the underfill 5 is formed to seal the opening 13a of the light reflective film 13.

The underfill 5 may be formed of the same material as the light reflective film 13 described above.

The underfill 5 may be omitted, but if the underfill 5 made of a material having a gas barrier property is used, a service life of the light emitting element 2 can be extended. Further, the underfill 5 made of a light reflective material can improve light emitting efficiency of the light emitting device 100. Still further, the underfill 5 having light reflectivity arranged to cover the upper face of the vaporproof member 4 can reduce an amount of light irradiated on the support member 11 in the gap 12a, which can further restrain deterioration of the support member 11 due to light irradiation, together with the effect of the vaporproof member 4 described above.

The light transmissive member 6 covers the light emitting element 2 mounted on the upper face of the mount substrate 1. The light transmissive member 6 is arranged to protect the light emitting element 2 etc. from external force, dust, gas etc. and to improve heat resistance, weather resistance, and light resistance of the light emitting element 2 etc. A material of the light transmissive member 6 may be thermosetting resin having a good light transmitting property, such as silicone resin, epoxy resin and urea resin. Besides these materials, the light transmissive member 6 may contain a fluorescent substance (wavelength conversion substance), a light reflective substance, a light diffusion substance, and/or other fillers to have predetermined functions.

Note that the light transmissive member 6 is preferably arranged to seal the entire light emitting element 2, but may be arranged to cover a portion of the light emitting element 2. Further, the light transmissive member 6 may be formed in a shape to constitute a lens.

The light transmissive member 6 containing particles of, for example, the fluorescent substance can easily adjust a color tone of the light emitting device 100. Note that the fluorescent substance may be one having a specific gravity larger than that of the light transmissive member 6, absorbing the light from the light emitting element 2 and converting wavelength. The fluorescent substance having a specific gravity larger than that of the light transmissive member 6 allows it to subside so as to be arranged near the face of the light emitting element 2.

Specifically, for example, a yellow fluorescent substance such as YAG ($Y_3Al_5O_{12}$:Ce) and silicate, or a red fluorescent substance such as CASN ($CaAlSiN_3$:Eu) and KSF ($K_2SiF_6$:Mn) may be used.

A filler contained in the light transmissive member 6 is preferably particles of, for example, $SiO_2$, $TiO_2$, $Al_2O_3$, $ZrO_2$ and MgO. Further, with the intent to remove light having undesired wavelength organic or inorganic coloring dye or coloring pigment, for example, may be contained.

Manufacturing Method for Light Emitting Device

Next, a description will be given of a manufacturing method for the light emitting device according to a first embodiment with reference to FIGS. 3 to 5F.

Figure 4:
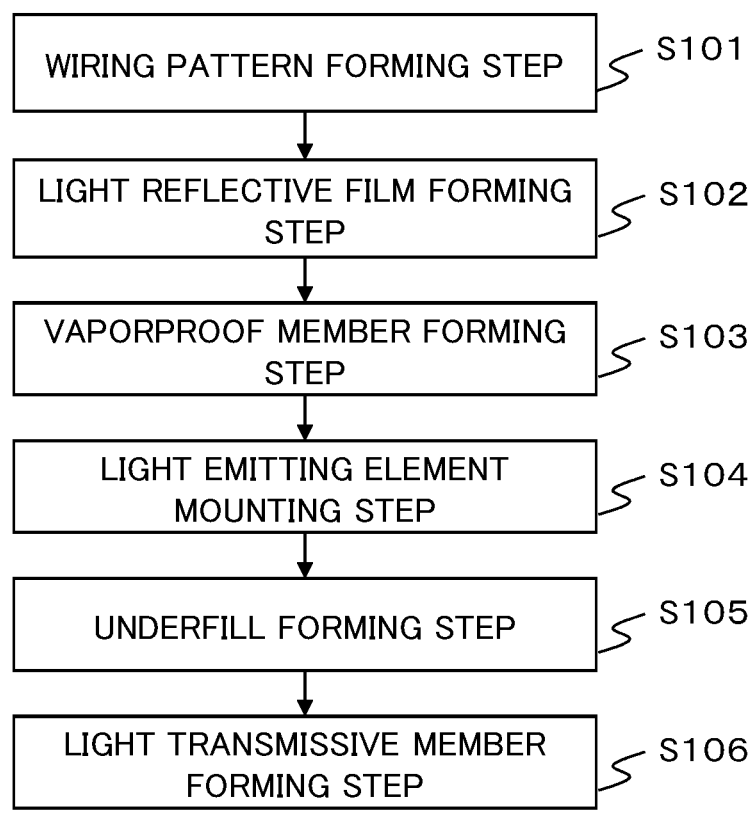
FIG. 4 is a flowchart showing steps of a manufacturing method for the light emitting device according to the first embodiment.
Figure 5A:
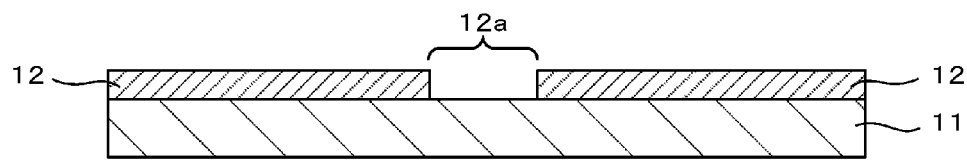
FIG. 5A is a cross-sectional view showing a wiring pattern forming step in the manufacturing method for the light emitting device according to the first embodiment.
Figure 5B:
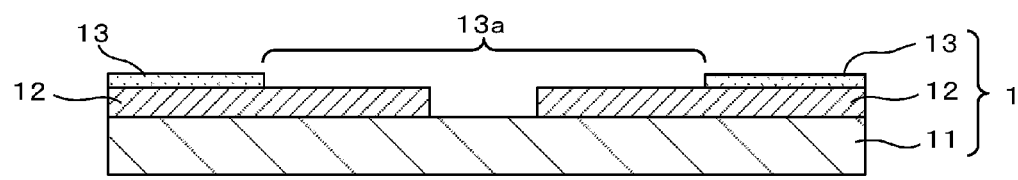
FIG. 5B is a cross-sectional view showing a light reflective film forming step in the manufacturing method for the light emitting device according to the first embodiment.
Figure 5C:
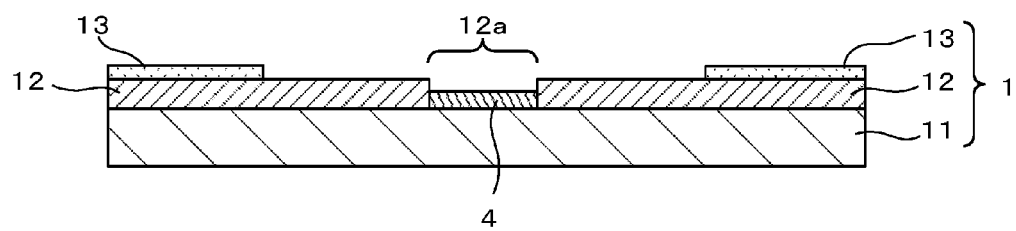
FIG. 5C is a cross-sectional view showing a vaporproof member forming step in the manufacturing method for the light emitting device according to the first embodiment.
Figure 5D:
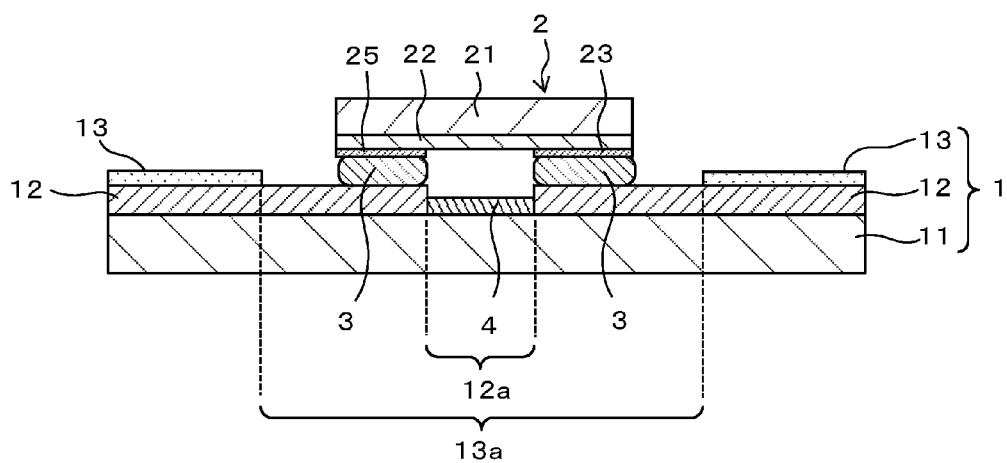
FIG. 5D is a cross-sectional view showing a light emitting element mounting step in the manufacturing method for the light emitting device according to the first embodiment.
Figure 5E:
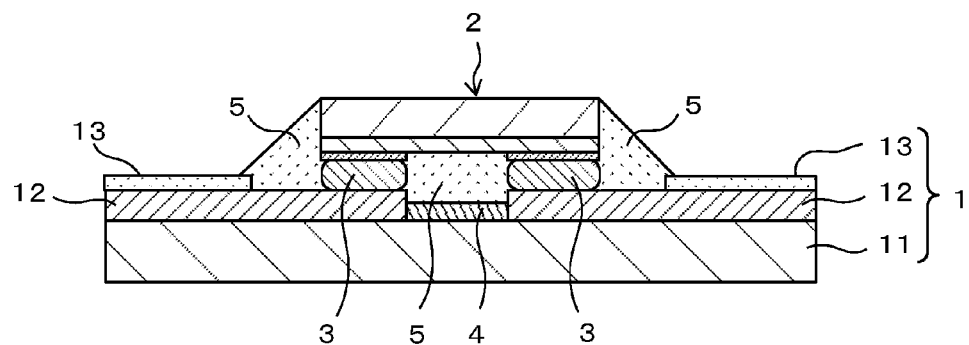
FIG. 5E is a cross-sectional view showing an underfill forming step in the manufacturing method for the light emitting device according to the first embodiment.
Figure 5F:
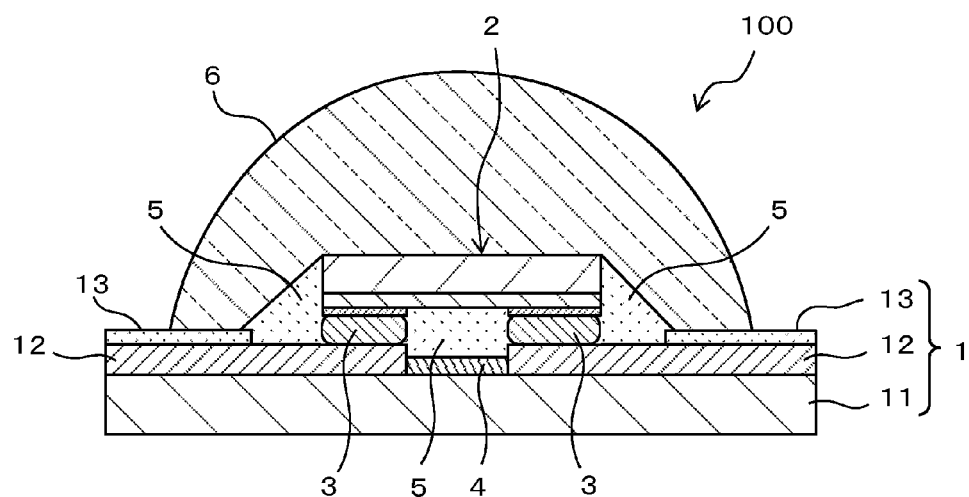
FIG. 5F is a cross-sectional view showing a light transmissive member forming step in the manufacturing method for the light emitting device according to the first embodiment.

FIG. 3 is a cross-sectional view showing an exemplary structure of the light emitting element used in the light emitting device according to the first embodiment. FIG. 4 is a flowchart showing steps of the manufacturing method for the light emitting device according to the first embodiment. FIG. 5A is a cross-sectional view showing a wiring pattern forming step in the manufacturing method for the light emitting device according to the first embodiment. FIG. 5B is a cross-sectional view showing a light reflective film forming step in the manufacturing method for the light emitting device according to the first embodiment. FIG. 5C is a cross-sectional view showing a vaporproof member forming step in the manufacturing method for the light emitting device according to the first embodiment. FIG. 5D is a cross-sectional view showing a light emitting element mounting step in the manufacturing method for the light emitting device according to the first embodiment. FIG. 5E is a cross-sectional view showing an underfill forming step in the manufacturing method for the light emitting device according to the first embodiment. FIG. 5F is a cross-sectional view showing a light transmissive member forming step in the manufacturing method for the light emitting device according to the first embodiment.

The manufacturing method for the light emitting device 100 according to the first embodiment includes a wiring pattern forming step S101, a light reflective film forming step S102, a vaporproof member forming step S103, a light emitting element mounting step S104, an underfill forming step S105 and a light transmissive member forming step S106.

In the wiring pattern forming step S101, a plurality of wirings 12 which are arranged apart from one another are formed on the upper face of the support member 11 in a sheet shape or plate shape using a conductive material such as metal. The gap 12a is formed between a pair of wirings 12 arranged adjacently at a predetermined distance. The wirings 12 may be formed by pasting metal foil such as Cu, Al, by coating a paste of metal powder such as Cu, Ag, or by plating Cu, etc. Further, the wirings 12 may be patterned by the etching method or the printing method.

In the light reflective film forming step S102, the light reflective film 13 is formed on the upper face of the support member 11 and the wirings 12 so as to have the opening 13a at the region where the light emitting element 2 is arranged and at the peripheral region thereof. The light reflective film 13 may be formed by the printing method or the coating method using white ink which is resin containing white pigment, or the like.

In the vaporproof member forming step S103, the vaporproof member 4 is formed to cover the upper face of the support member 11 at the region directly under the light emitting element 2 and the peripheral region thereof in a plan view in the gap 12a between the wirings 12 arranged adjacently to one another.

The vaporproof member 4 may be formed by the printing method or the coating method if a resin material is used, or by the sputtering method, CVD method (chemical vapor deposition) etc. if an inorganic material is used.

In the light emitting element mounting step S104, the light emitting element 2 is mounted on the mount substrate 1 by bonding the electrodes of the light emitting element 2 with the wirings 12 via the bonding member 3 such as a metal bump. With the face on which the n-side electrode 23 and the p-side electrode 25 are arranged as a pair of electrodes facing downward, the light emitting element 2 is arranged to cross the gap 12a between the pair of wirings 12. The n-side electrode 23 and p-side electrode 25 of the light emitting element 2 are connected to corresponding wirings 12, respectively.

In the underfill forming step S105, the underfill 5 is filled in a space between the lower face of the light emitting element 2 and the upper face of the mount substrate 1 and formed to cover the side faces of the light emitting element 2. The underfill 5 is formed by supplying, with a dispenser or the like, white resin preferably having light reflectivity because of containing a light reflective substance, on the region around the light emitting element 2.

In the light transmissive member forming step S106, the light transmissive member 6 is formed to cover the light emitting element 2. The light transmissive member 6 may be formed by the potting method, the printing method, the resin molding method using a mold, etc., using a material containing particles of a fluorescent substance as a wavelength conversion substance or a light diffusion substance or other filler in light transmissive resin depending on the purpose.

With such steps, the light emitting device 100 is manufactured.

Second Embodiment

Next, a description will be given of a light emitting device according to a second embodiment with reference to FIG. 6.

FIG. 6 is a cross-sectional view showing a structure of the light emitting device according to the second embodiment.

A light emitting device 100A according to the second embodiment uses a mount substrate 1A in which the support member 11 and a vaporproof member 4A are integrally formed, in place of the mount substrate 1 and the vaporproof member 4 in the light emitting device 100 according to the first embodiment.

The mount substrate 1A includes the sheet-shaped vaporproof member 4A which covers the entire upper face of the support member 11, and the wirings 12 and the light reflective film 13 are arranged on an upper face of the vaporproof member 4A.

The entire upper face of the support member 11 is seamlessly covered with the sheet-shaped vaporproof member 4A, which can restrain permeation of moisture vapor from the upper face where light from the light emitting element 2 may be irradiated. Therefore, deterioration of the support member 11 due to light irradiation can be restrained more effectively.

The vaporproof member 4A may be formed of the same material as the vaporproof member 4 in the first embodiment.

The vaporproof member 4A is, in place of the vaporproof member forming step S103 in the first embodiment, formed to cover the upper face of the support member 11 prior to the wiring pattern forming step S101.

Note that the vaporproof member 4A may be formed by pasting or crimping a sheet-shaped vaporproof material on the upper face of the support member 11. Further, the vaporproof member 4A may also be formed by coating a liquid vaporproof material on the upper face of the support member 11.

The vaporproof member 4A is arranged on the entire upper face of the support member 11 with no need of patterning, to simplify the step for forming the vaporproof member 4A.

Steps for other members are the same as those in the first embodiment and the descriptions thereof are omitted.

Third Embodiment

A description will be given of a light emitting device according to a third embodiment with reference to FIG. 7. FIG. 7 is a cross-sectional view showing a structure of the light emitting device according to the third embodiment.

A light emitting device 100B according to the third embodiment includes a vaporproof member 4B, in place of or in addition to the vaporproof member 4 in the light emitting device 100 according to the first embodiment.

The vaporproof member 4B is arranged with a sheet-shaped vaporproof material to cover an entire outer face of the light transmissive member 6. In other words, the region directly under the light emitting element 2 of the support member 11 and peripheral region thereof are covered by the vaporproof member 4B via the light transmissive member 6 and other members arranged within the light transmissive member 6. Accordingly, the vaporproof member 4B restrains permeation of moisture vapor from the upper face of the support member 11. Thus, deterioration of the upper face of the support member 11 due to light irradiation from the light emitting element 2 can be restrained.

Note that the vaporproof member 4B may be arranged to cover not only the outer face of the light transmissive member 6 but the entire upper face of the mount substrate 1A continuously. This can further restrain permeation of moisture vapor from the upper face of the support member 11 more effectively. Especially, by covering the entire outer face of the light transmissive member 6 with the vaporproof member 4B continuously, and additionally, by arranging the vaporproof member 4 between the wirings on the support member 11, deterioration of the support member 11 due to light irradiation can be restrained further more effectively.

The vaporproof member 4B can be formed of the same material as that of the vaporproof member 4. As being arranged on a light extraction face of the light emitting device 100B, the vaporproof member 4B preferably has a good light transmissive property.

The vaporproof member 4B is, in place of the vaporproof member forming step S103 in the first embodiment, formed to cover the outer face of the light transmissive member 6 after the light transmissive forming step S106.

The vaporproof member 4B may be formed by pasting a sheet-shaped vaporproof material on the upper face of the light transmissive member 6. Further, the vaporproof member 4B may be formed by coating a liquid vaporproof material on the outer face of the light transmissive member 6.

Still further, in a case where the vaporproof member 4B is arranged to cover not only the outer face of the light transmissive member 6 but the entire upper face of the mount substrate 1, the vaporproof member 4B does not need to be pasted nor coated in accordance with a shape of the light transmissive member 6, allowing the step for forming the vaporproof member 4B to be simplified.

Steps for other members are the same as those in the first embodiment, and the descriptions thereof will be omitted.

Fourth Embodiment

Figure 8:
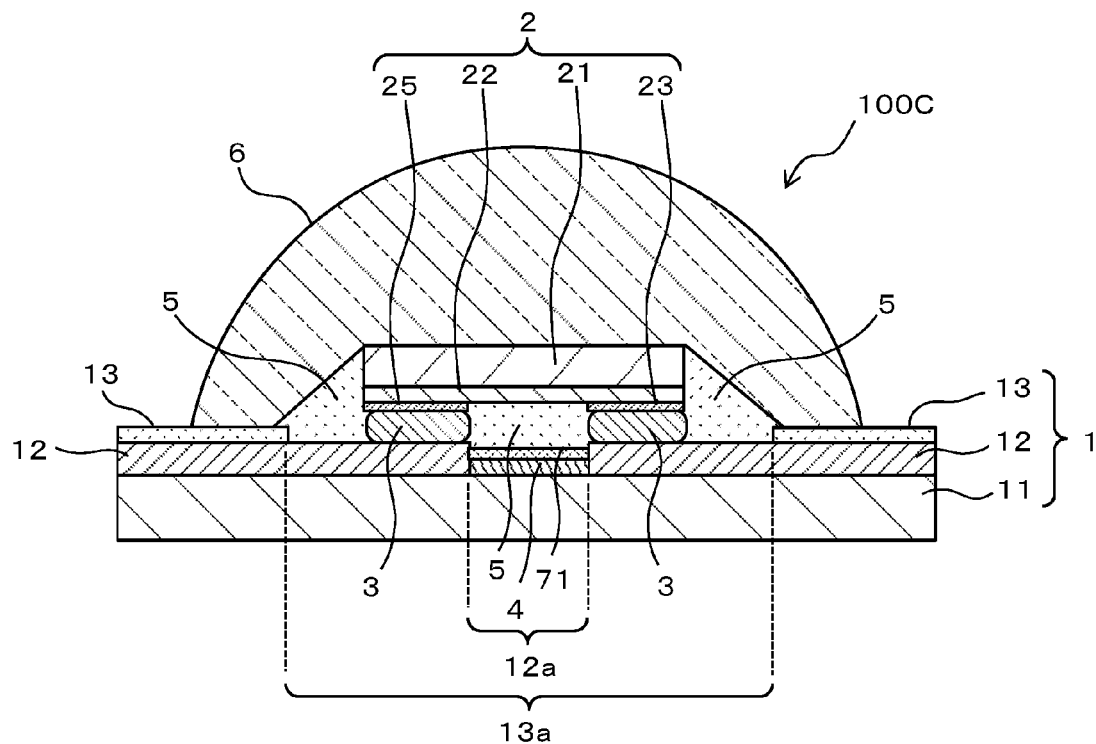
FIG. 8 is a cross-sectional view showing a structure of a light emitting device according to a fourth embodiment.

A description will be given of a light emitting device according to a fourth embodiment with reference to FIG. 8. FIG. 8 is a cross-sectional view showing a structure of the light emitting device according to the fourth embodiment.

A light emitting device 100C according to the fourth embodiment further includes a first light reflective member 71 to cover the upper face of the vaporproof member 4 in the light emitting device 100 according to the first embodiment.

The first light reflective member 71 is formed to laminate the upper face of the vaporproof member 4 and is preferably arranged at least in the same region as the vaporproof member 4. In other words, by arranging the first light reflective member 71 in a region where light from the light emitting element 2 is irradiated strongly, an amount of light irradiated on the support member 11 in the region can be reduced. Therefore, deterioration of the support member 11 due to light can be more effectively restrained, together with vaporproof effect by the vaporproof member 4.

The first light reflective member 71 is formed of a material containing at least one selected from titanium oxide, aluminum oxide, zinc oxide, barium carbonate and barium sulfate as a light reflective substance in light transmissive resin such as silicone resin and epoxy resin.

The first light reflective member 71 may be formed of the same material as that of the underfill 5, but preferably has higher reflectance than the underfill 5 by having more contents of a light reflective substance. Specifically, the first light reflective member 71 preferably reflects 80% or more of light from the light emitting element 2. Unlike the underfill 5, the first light reflective member 71 does not need to have a bonding property with the light emitting element 2 to be taken into account, or does not need to be filled underneath the light emitting element 2 after the light emitting element 2 is mounted, so that the first light reflective member 71 can be formed to have high reflectance even the first light reflective member 71 is thinner than the underfill 5.

The first light reflective member 71 is formed to cover the upper face of the vaporproof member 4 between the vaporproof member forming step S103 and the light emitting element mounting step S104 in the first embodiment. The first light reflective member 71 can be formed, similar to the light reflective film 13, by the printing method or the coating method.

Steps for other members are the same as those in the first embodiment, and the explanations therefor are omitted.

Note that, even in the light emitting device 100A according to the second embodiment, the first light reflective member 71 may be arranged in a region such as the gap 12a where light from the light emitting element 2 is strongly irradiated. Accordingly, an amount of light irradiated on the upper face of the support member 11 of the light emitting device 100A can be reduced.

Fifth Embodiment

Figure 9:
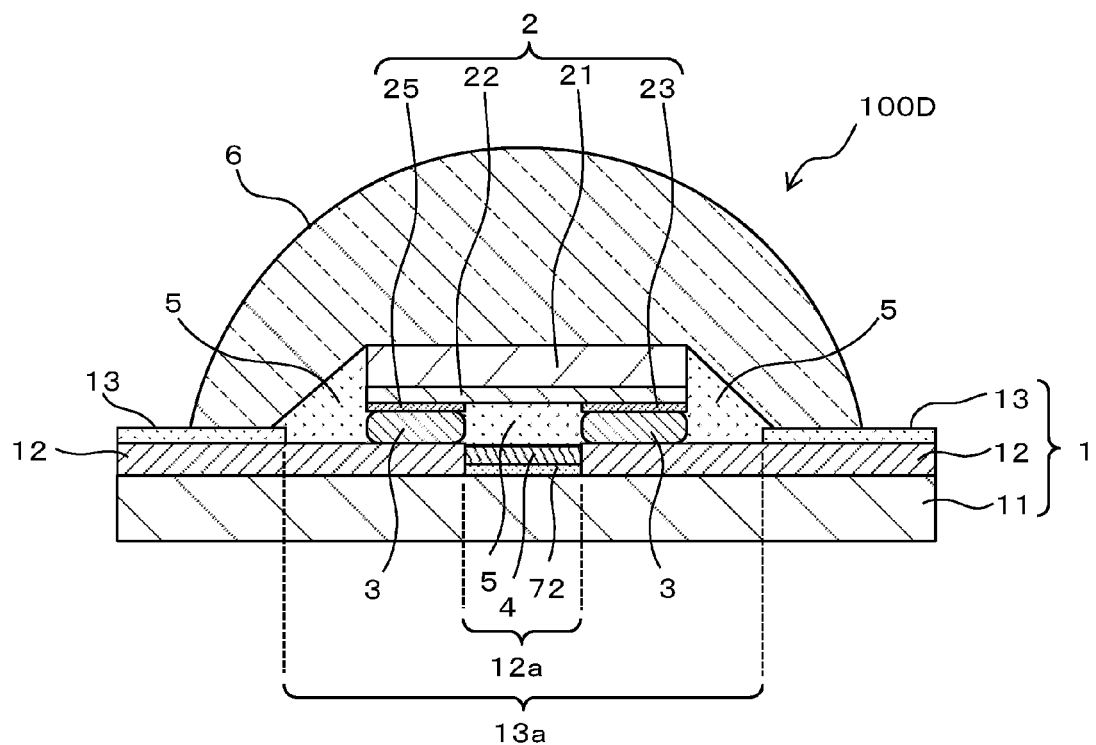
FIG. 9 is a cross-sectional view showing a structure of a light emitting device according to a fifth embodiment.

A description will be given of a light emitting device according to a fifth embodiment with reference to FIG. 9. FIG. 9 is a cross-sectional view showing a structure of the light emitting device according to the fifth embodiment.

A light emitting device 100D according to the fifth embodiment further includes a second light reflective member 72 between the support member 11 and the vaporproof member 4 in the light emitting device 100 according to the first embodiment.

Preferably, the second light reflective member 72 is formed on the support member 11 in the gap 12a between the wirings 12 and is arranged at least in the same region as the vaporproof member 4 which laminates the second light reflective member 72. In short, by arranging the second light reflective member 72 in the region where light from the light emitting element 2 is strongly irradiated, an amount of light irradiated on the support member 11 in the region can be reduced. Therefore, together with the vaporproof effect by the vaporproof member 4, deterioration of the support member 11 due to light can be more effectively restrained.

Preferably, the second light reflective member 72 can be formed of the same material as that of the first light reflective member 71 in the fourth embodiment and has higher reflectance than that of the underfill 5. Specifically, the second light reflective member 72 preferably reflects 80% or more of light from the light emitting element 2. As with the first light reflective member 71 described above, the second light reflective member 72, unlike the underfill 5 does not need have a bonding property with the light emitting element 2 to be taken into account, or does not need to be filled underneath the light emitting element 2 after the light emitting element 2 is mounted, so that the second light reflective member 72 can be formed to have high reflectance even the second light reflective member 72 is thinner than the underfill 5.

The second light reflective member 72 is formed to cover the upper face of the support member 11 in the gap 12a prior to the vaporproof member forming step S103 in the first embodiment. The second light reflective member 72 can be formed, similar to the light reflective film 13, by the printing method or the coating method.

Note that the second light reflective member 72 may be formed either before or after the light reflective film forming step S102.

Steps for other members are the same as those in the first embodiment, and the descriptions thereof are omitted.

Further, the light emitting device 100D may further include the first light reflective member 71. Accordingly, an amount of light irradiated on the upper face of the support member 11 can further be reduced.

Sixth Embodiment

Figure 10:
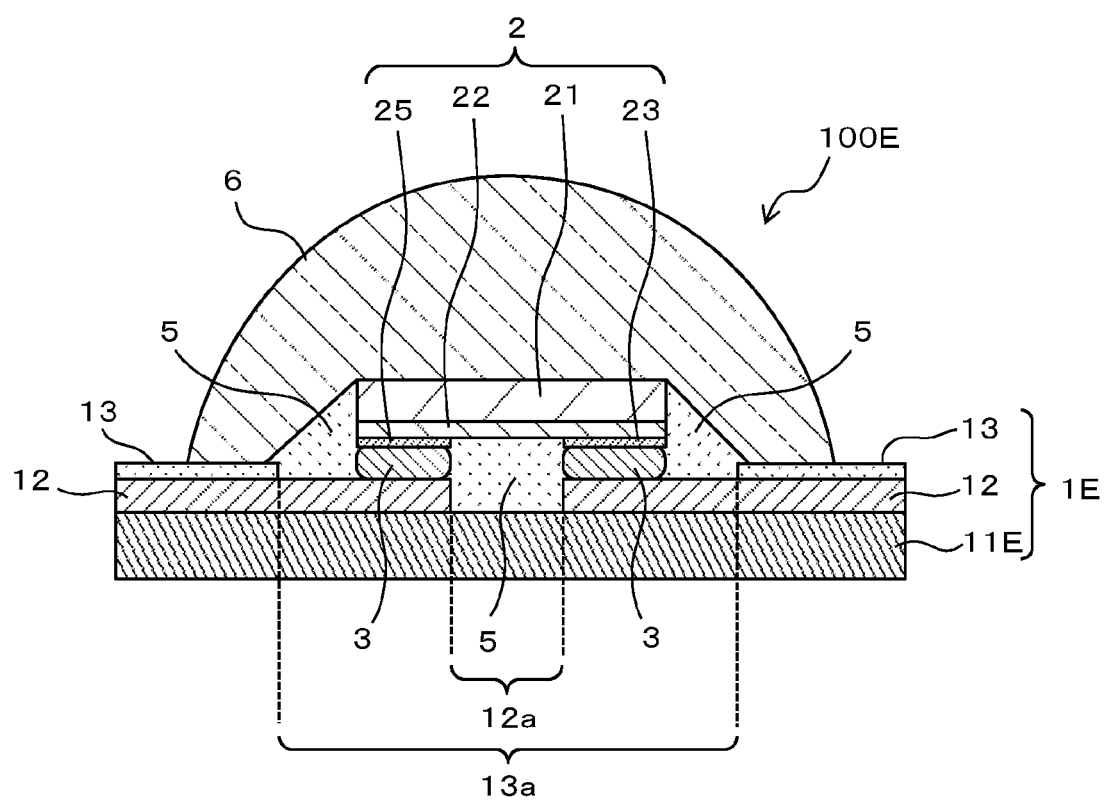
FIG. 10 is a cross-sectional view showing a structure of a light emitting device according to a sixth embodiment.

A description will be given of a light emitting device according to a sixth embodiment with reference to FIG. 10. FIG. 10 is a cross-sectional view showing a structure of the light emitting device according to the sixth embodiment.

A light emitting device 100E according to the sixth embodiment includes a mount substrate 1E employing a support member 11E made of a vaporproof material, in place of the mount substrate 1 and the vaporproof member 4 in the light emitting device 100 according to the first embodiment.

The mount substrate 1E is configured to have the wirings 12 and the light reflective film 13 on the upper face of the support member 11E made of a vaporproof material. The support member 11E itself is formed of the above-mentioned vaporproof material, preventing the support member 11E from being deteriorated due to light irradiation from the light emitting element 2 even a separate vaporproof member is not arranged in the gap 12a between the wirings 12.

The support member 11E is preferably formed thinly to an extent to have sufficient strength as a base of a flexible substrate, having the thickness of 4 µm or more but 50 µm or less.

In the manufacturing method for the light emitting device 100 according to the first embodiment, the light emitting device 100E can be manufactured by using the mount substrate 1E including the support member 11E having a vaporproof property in place of the mount substrate 1 and omitting the vaporproof member forming step S103, and then, the description of each step is omitted.

Further, in the light emitting device 100E, a light reflective member having the same structure as the first light reflective member 71 in the fourth embodiment may be arranged in the gap 12a between the wirings 12. Accordingly, light irradiation from the light emitting element 2 on the support member 11E is reduced, further restraining deterioration of the support member 11E.

As explained above, the light emitting device according to each embodiment can restrain deterioration of the support member due to light irradiation, by covering the region where light from the light emitting element is strongly irradiated on the upper face of the support member made of resin with the vaporproof member or by forming the support member itself with the vaporproof material. Effects to dielectric strength voltage due to deterioration of the support member appear in a shorter time as the support member is formed thinner. Thus, if a flexible substrate having a thin support member is used as a mount substrate, the light emitting device according to each embodiment is especially advantageous.

Example 1

The light emitting device having the configuration shown in FIG. 6 is manufactured with conditions below.

Further, light resistance of the support member used for manufacturing the light emitting device is evaluated using the lighting device 200.

Light Resistance Evaluation for Support Member

The "EMBLET (trademark) DC KPT-12" manufactured by UNITIKA LTD. is used as the support member of which the entire upper face is covered with the vaporproof member. The KPT-12 is a film arranged with a polyvinylidene chloride layer having a film thickness of 1.5 µm (corresponding to the vaporproof member) on one side of a PET film having a thickness of 12 µm (corresponding to the support member). Note that the moisture vapor permeability rate of this film is 15 g/(m$^2$·day). Also note that the moisture vapor permeability rate is a value measured by an infra-red sensor under a condition of 40° C. and 90% RH based on JIS K7129.

The KPT-12 as a sample was placed in the lighting device 200 and light from an LED was irradiated under a condition of 85° C. and 85% RH, and the time till a hole was formed at a portion of the sample where light was irradiated was measured. An evaluation result is shown as a sample 3 in a table 2. Note that a sample 1 and a sample 2 in the table 2 are above-described conventional PET films. In addition, a sample 4 is a film used in an example 2 to be described later, and a sample 5 is a single film of polyimide as a comparative example in the example 2.

TABLE 2

|  | thickness [µm] | moisture vapor permeability rate [g/(m$^2$ · day)] | deterioration time [h] |
| --- | --- | --- | --- |
| Sample 1 | 50 | 35 | 72 |
| Sample 2 | 50 | 28 | 96 |
| Sample 3 | 13.5 | 15 | 240 |
| Sample 4 | 50 | 2 | 672 |
| Sample 5 | 25 | 84 | Less than 24 |

As shown in the table 2, the time till a hole was formed in the sample 3 was 240 hours. The sample 3 lasts more than twice with respect to the samples 1 and 2 of conventional PET films. Further, in consideration that the film thickness of the sample 3 is about ¼ of the samples 1 and 2, deterioration of the support member due to light is found to be greatly restrained by arranging the vaporproof member.

Manufacturing of Light Emitting Device

A copper film having a thickness of 3.5 µm is pasted on a polyvinylidene chloride layer of the support member made of the above-mentioned KPT-12 film and a predetermined patterning by the etching method is applied to form wirings for preparing a mount substrate. Note that a member corresponding to the light reflective film 13 in FIG. 6 is not arranged.

LED chips as light emitting elements which are a square of side 600 µm in a plan view are flip-chip mounted on the wirings of the mount substrate with the use of SnCu solder as a bonding member. Note that the LED chips are blue LEDs having a wavelength of 450 nm as a light emission peak wavelength of a light emission spectrum.

An underfill material is coated around the light emitting elements. Note that a resin material is used as an underfill material, in which titanium oxide having an average particle size of 0.25 µm is contained in silicone resin with a content rate by 30 mass %.

Silicone resin is used as light transmissive members to seal the light emitting elements and to form a dome shape.

The light emitting device thus manufactured is effective to restrain permeation of moisture vapor to the PET film as the support member and to restrain deterioration of the PET film due to light from the light emitting elements (LED chips) under a high-temperature and high-humidity condition.

Example 2

The light emitting device having the configuration shown in FIG. 10 was manufactured under a condition below.

Further, light resistance of the support member used for manufacturing the light emitting device was evaluated using the lighting device 200 under the condition of 85° C. and 85% RH.

Light Resistance Evaluation of Support Member

The "Toughclaist" manufactured by SUMITOMO SEIKA CHEMICALS CO., LTD. was used as the vaporproof support member. The used support member is a film having a thickness of 50 µm and containing polyimide with layered crystals of talc as clay mineral. Note that moisture vapor permeability rate of this film is 2 g/(m$^2$·day) (measuring method is based on JIS K7129). An evaluated (evaluation) result is shown as a sample 4 in the table 2.

Further, as a comparative example, a film of elemental polyimide was evaluated under the same condition. The evaluation result is shown as a sample 5 in the table 2. Note that the polyimide film used as the sample 5 is the "KAPTON (trademark) H-type" manufactured by DU PONT-TORAY CO., LTD having a thickness of 25 µm. Further, moisture vapor permeability rate of the sample 5 is 84 g/(m$^2$·day) (measuring method is based on JIS K7129).

As shown in the table 2, the time till a hole was formed in the sample 4 was 672 hours. On the other hand, the time till a hole was formed in the film of elemental polyimide as the sample 5 was less than 24 hours. Even taking a difference in a film thickness in consideration, it will be understood that vaporproof property of the support member itself can remarkably restrain deterioration of the support member due to light.

Manufacturing of Light Emitting Device

The Toughclaist film described above was used as the support member, and the members described in the example 1 are used as other members to manufacture the light emitting device.

The light emitting device thus manufactured is effective to restrain permeation of moisture vapor to the support member and to restrain deterioration of the support member due to light from the light emitting elements (LED chips) under a high-temperature and high-humidity condition.

The light emitting device according to the embodiments of the present invention can be used as various light sources such as a back light source of a liquid crystal display, various lighting devices, a large-sized display, various display devices such as for advertisement and destination guide, and further, an image reading device in a digital video camera, a facsimile, a copier, a scanner or the like, and a projector.

What is claimed is:

1. A light emitting device comprising:
 a support member that is made of resin;
 a pair of wirings that are arranged on the support member;
 a light emitting element that is arranged to cross the pair of wirings and that has a pair of electrodes on one side running in parallel to the pair of wirings so as to be electrically connected; and
 a vaporproof member in a film shape that seamlessly covers an upper face of the support member, at least, in a region where the light emitting element is arranged between the pair of wirings in a plan view,
 wherein the vaporproof member has a higher vaporproof property than that of the support member, wherein the vaporproof member has a moisture vapor permeability rate of 20.0 g/(m² ·day) or less, where g represents grams and m represents meters, and wherein the vaporproof member is not in contact with the light emitting element.

2. The light emitting device according to claim 1, wherein the support member is in a sheet shape and is flexible.

3. The light emitting device according to claim 2, wherein the support member has an even thickness.

4. The light emitting device according to claim 3, wherein the support member is flat from a region under the pair of wirings through another region between the pair of wirings.

5. The light emitting device according to claim 1, wherein the vaporproof member is in a sheet shape that covers an entire upper face of the support member, and wherein the pair of wirings are arranged on the vaporproof member.

6. The light emitting device according to claim 1, wherein the vaporproof member is arranged, in a plan view, in the region where the light emitting element is arranged and a peripheral region thereof.

7. The light emitting device according to claim 6, wherein the peripheral region is a region where a distance from the light emitting element in a plan view is within 2 millimeters (mm).

8. The light emitting device according to claim 1, further comprising a first light reflective member that covers an upper face of the vaporproof member.

9. The light emitting device according to claim 8, wherein the first light reflective member reflects 80% or more of light from the light emitting element.

10. The light emitting device according to claim 1, further comprising a second light reflective member that covers the support member between the support member and the vaporproof member.

11. The light emitting device according to claim 10, wherein the second light reflective member is formed of a material comprising at least one selected from titanium oxide, aluminum oxide, zinc oxide, barium carbonate, or barium sulfate in light transmissive resin.

12. The light emitting device according to claim 10, wherein the second light reflective member reflects 80% or more of light from the light emitting element.

13. The light emitting device according to claim 1, further comprising a light transmissive member that covers the light emitting element, wherein the vaporproof member is transmissive to light and covers an entire outer face of the light transmissive member.

14. The light emitting device according to claim 13, further comprising a second light reflective member that covers the support member between the support member and the light emitting element.

15. The light emitting device according to claim 13, wherein the light transmissive member comprises a wavelength conversion substance.

16. The light emitting device according to claim 13, wherein the light transmissive member comprises a lens.

17. The light emitting device according to claim 1, further comprising an underfill that is disposed between the vaporproof member and the light emitting element.

18. A light emitting device comprising:
a support member being insulative and flexible in a sheet shape;
a pair of wirings arranged on the support member; and
a light emitting element that is arranged to cross the pair of wirings and that has a pair of electrodes on one side running in parallel to the pair of wirings so as to be electrically connected,
wherein the support member has a moisture vapor permeability rate of 20.0 g/(m² ·day) or less, where g represents grams and m represents meters.

19. The light emitting device according to claim 18, further comprising a light reflective member that covers an upper face of the support member, at least, in a region where the light emitting element is arranged between the pair of wirings in a plan view.

20. The light emitting device according to claim 19, wherein the light reflective member reflects 80% or more of light from the light emitting element.

21. A light emitting device comprising:
a support member that is made of resin;
a pair of wirings that are arranged on the support member;
a light emitting element that is arranged to cross the pair of wirings and that has a pair of electrodes on one side running in parallel to the pair of wirings so as to be electrically connected; and
a vaporproof member in a film shape that seamlessly covers an upper face of the support member, at least, in a region where the light emitting element is arranged between the pair of wirings in a plan view,
wherein the vaporproof member has a higher vaporproof property than that of the support member,
wherein the vaporproof member has a thickness less than or equal to that of the pair of wirings, and
wherein the vaporproof member is not in contact with the light emitting element.

22. The light emitting device according to claim 21, wherein the pair of wirings has a thickness less than or equal to 50 micrometers (μm), and
wherein the vaporproof member has a thickness less than or equal to 50 μm.

* * * * *